(12) United States Patent
Inobe

(10) Patent No.: US 9,714,757 B2
(45) Date of Patent: Jul. 25, 2017

(54) LIGHT EMITTING DEVICE

(71) Applicant: NICHIA CORPORATION, Anan-shi, Tokushima (JP)

(72) Inventor: Mototaka Inobe, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/136,749

(22) Filed: Dec. 20, 2013

(65) Prior Publication Data

US 2014/0185296 A1   Jul. 3, 2014

(30) Foreign Application Priority Data

Dec. 28, 2012 (JP) .................................. 2012-288363

(51) Int. Cl.
| | |
|---|---|
| *F21V 21/00* | (2006.01) |
| *F21V 21/14* | (2006.01) |
| *F21V 31/00* | (2006.01) |
| *F21V 19/00* | (2006.01) |
| *F21S 4/24* | (2016.01) |
| *F21Y 115/10* | (2016.01) |

(52) U.S. Cl.
CPC ................ *F21V 21/14* (2013.01); *F21S 4/24* (2016.01); *F21V 19/001* (2013.01); *F21V 31/005* (2013.01); *F21Y 2115/10* (2016.08)

(58) Field of Classification Search
CPC .... F21V 21/005; F21V 21/008; F21V 23/004; F21V 21/14; F21V 31/005; F21L 14/023

USPC ........................................ 362/217.12, 217.17
See application file for complete search history.

(56) References Cited

U.S. PATENT DOCUMENTS

| | | | |
|---|---|---|---|
| 2009/0226656 A1* | 9/2009 | Crandell et al. ............. | 428/40.1 |
| 2010/0073959 A1 | 3/2010 | Hamada | |
| 2010/0226126 A1 | 9/2010 | Naito et al. | |
| 2012/0113633 A1* | 5/2012 | Bowen ................. | F21L 14/023 |
| | | | 362/235 |
| 2013/0002985 A1 | 1/2013 | Hosoki | |
| 2013/0120979 A1* | 5/2013 | Chen et al. ............. | 362/217.17 |
| 2013/0176739 A1* | 7/2013 | Uehara .................... | 362/296.01 |
| 2013/0221827 A1* | 8/2013 | Kato ............................ | 313/46 |

FOREIGN PATENT DOCUMENTS

| | | |
|---|---|---|
| JP | 2010-212283 A | 9/2010 |
| JP | 2011-228602 A | 11/2011 |
| JP | 2012-142362 A | 7/2012 |
| WO | 2008-090646 A1 | 7/2008 |
| WO | 2011-083634 A1 | 7/2011 |

* cited by examiner

*Primary Examiner* — Karabi Guharay
(74) *Attorney, Agent, or Firm* — Global IP Counselors, LLP

(57) ABSTRACT

A light emitting device with good handling performance for storage, transportation, or in use, which can prevent stress from concentrating on the light emitting elements. The substrate member includes a first end portion, a middle portion, and a second end portion. The first end portion defines a locking hole for insertion of a locking bar. A plurality of light emitting elements are disposed on the middle portion. On the second end portion, an electronic member such as a Zener Diode, a Bridge Diode, a connector, a fuse, a resistance etc., is disposed.

18 Claims, 4 Drawing Sheets

LIGHT EMITTING DEVICE

CROSS-REFERENCE TO RELATED APPLICATION

This application claims priority to Japanese Patent Application No. 2012-288363, filed on Dec. 28, 2012. The entire disclosure of Japanese Patent Application No. No. 2012-288363 is hereby incorporated herein by reference.

BACKGROUND OF THE INVENTION

Technical Field
The present disclosure relates to a light emitting device.
Background Information
There has been known a light emitting device which includes a plurality of light emitting elements disposed on a flexible substrate member (see Patent Literature 1: JP2011-22860A). In Patent Literature 1: JP2011-228602A, roll-to-roll processing is employed, in which, while pulling out a roll of a flexible substrate member, light emitting elements are disposed on the flexible substrate member, and then re-reeling the flexible substrate member after arranging them. A roll of flexible and long light emitting device can facilitate handling at the time of storage or transportation.

SUMMARY OF THE INVENTION

A light emitting device according to the embodiments of the present invention includes a flexible substrate member, a plurality of light emitting elements, and an electric component. The substrate member includes a first end portion, a second end portion placed at opposite side from the first end portion in a longitudinal direction, and a middle portion placed between the first portion and the second portion. The substrate member is formed extending in the longitudinal direction. The plurality of light emitting elements are disposed on the middle portion. The electrical component is disposed on the second end portion and electrically connected to the plurality of light emitting elements. The substrate member includes a locking hole defined in the first end portion.

According to the present invention, a light emitting device with good handling performance for storage, transportation, or in use, which can prevent stress from concentrating on the light emitting elements.

DETAILED DESCRIPTION OF EMBODIMENTS

Figure 1A:
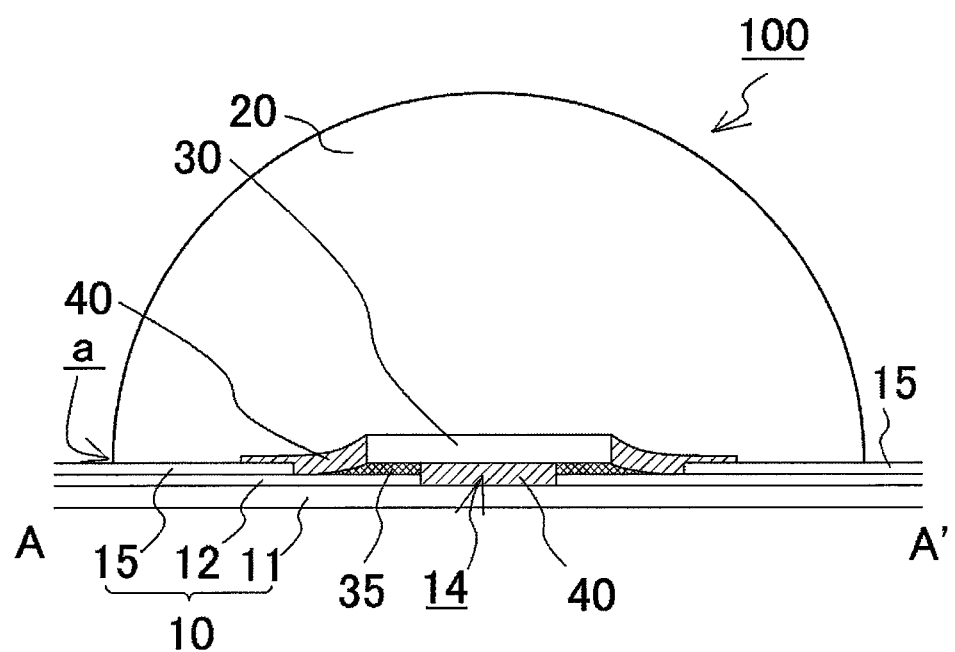
FIG. 1A is a schematic cross-sectional view taken along line A-A' in FIG. 1B showing a light emitting device according to an embodiment of light emitting device of the present invention.

A light emitting device according to the present disclosure includes mainly, a substrate member, a light emitting element, and a sealing member. Two embodiments are described hereinbelow. Reference numerals are provided with reference to specific embodiments. Prior to describing the specific embodiments, a brief description of the basic features of the light emitting device of the present invention is provided.

Substrate Member 10

The substrate member is formed extending in the longitudinal direction. The substrate member includes a first end portion, a middle portion, and a second end portion. The first end portion defines a locking hole which penetrates the substrate member. The middle portion is arranged between the first end portion and the second end portion. A plurality of light emitting elements are arranged on the middle portion. The second end portion is arranged at an opposite side from the first end portion in the longitudinal direction. An electrical component is disposed on the second end portion. For the electrical component, for example, a protective element such as a Zener diode or a bridge diode, an associated member such as a connector for external connection, a fuse, a resistance may be employed.

In the present embodiment, storage and/or transportation of a plurality of light emitting device in a state such as hanged on a locking bar, bundled with a ring or cord is assumed. A plurality of light emitting devices can be arranged compact by inserting a locking bar through the locking holes of respective light emitting devices or by bundling a plurality of light emitting devices with a ring or a cord. As described above, a plurality of light emitting devices can be kept compactly, which facilitates storage or transportation of a plurality of light emitting devices. Also, compared to the case where the light emitting device is stored in a rolled-up state, the stress can be prevented from concentrating on the light emitting elements and/or the sealing member as described below.

Further, in the case where a light emitting device is hanged on a locking bar, or bundled with a ring or a cord and hanged, the second end portion is located at a lower end of the light emitting device. Therefore, the electrical component disposed on the second end portion serves as a weight, so that the entire light emitting device can be kept straight. Therefore, compared to the case where the light emitting device is held rolled-up, the light emitting device as a whole can be prevented from curling or twisting.

The locking hole can be made with a size which allows insertion of a locking member (a bar, a ring, a cord, etc.). The locking hole can have any shape which allows insertion of the locking member. Also, at a portion which does not affect driving, the locking hole may be made in a hook shape so that the locking hole is connected to the end portion of the substrate member, or perforations may be formed from the locking hole to the end of the substrate member, which allow easy removal from the locking member.

The substrate member includes at least a base member, a plurality of wiring portions disposed on the base member, a covering layer disposed on the wiring portions, and the locking hole described above.

It is preferable that the wiring portions are not exposed at the periphery of the locking hole (at or near the inner circumference of the hole). This is because, depending on the material to be inserted, accidental connection may be established with the wirings to generate unnecessary current flow.

The base member is a basic component of the light emitting device and has flexibility. As long as the flexibility can be maintained, the base member can be formed by using an appropriate material according to the purpose and applications, and also in view of mounting of the light emitting element, the reflectance, adhesiveness with other members. Examples of such material include an insulating or conductive material such as plastic and metal foil. More specifically, a resin such as polyethylene terephthalate and polyimide may be preferably used. Particularly, in the case where solder is used for mounting light emitting elements, polyimide, which has high thermal resistance, is more preferably used. In addition, a material which can increase optical reflectance (for example, a white filler such as $SiO_2$, $TiO_2$, $Al_2O_3$, $ZrO_2$, MgO, or $BaSO_4$; or pores of submicron sizes) may be contained in the material constituting the base member.

The thickness of the base member can be in a range so as not to impair the flexibility, and for example, the thickness of about 10 μm to 500 μm can be employed, and about 10 μm to 200 μm or further about 10 μm to 100 μm is preferable.

The base member can be made with an appropriate shape (size, length, width) according to the aim and applications. The base member substantially defines the shape of the substrate member, and the example of the shape include a quadrangular shape, a rectangular shape, a polygonal shape, a circular shape, an elliptical shape, or a shape which is a combination of these shapes. In the case where the light emitting device according to an embodiment of the present invention is used for straight tube-type lighting equipments, an elongated shape extending in the longitudinal direction can be preferably employed. For example, the ratio in the longitudinal direction to the lateral direction can be about 5 to 200:1, and about 5 to 100:1, about 10 to 30:1 or about 10 to 20:1 is more preferable. A flexible base member can be used in a deformed state such as in a curved or bent state. Therefore, in the case where one light emitting device to be arranged, the flexible base member having a width and length several mm to several cm larger than the width and length of the housing member of the device can be used. Also, even in the case where a plurality of light emitting devices are to be arranged, the total area of the devices can be about several mm to several cm larger than the housing member of the devices.

For example, in the case of light source for straight tube-type lighting, more specifically, in the case of a straight tube-type lighting of about 120 cm in length (a 40-type), one light emitting device employing a base member of 0.5 cm to 5 cm in width and 100 cm to 150 cm in length can be used, or a plurality of light emitting devices each employing a base member of 0.5 cm to 5 cm in width and 20 cm to 70 cm in length can be used.

For the backlight light source for liquid crystal display televisions, an appropriate shape (size, length, and width) can be employed corresponding to the size (the number of inches) of the liquid crystal panel to be used. For example, in the case where the light emitting device is used for the backlight of a 55-inch liquid crystal display television in direct illumination-type application, fifteen (15) base members each having a width of 80 mm and a length of 680 mm may be employed, or thirty (30) base members each having a width of 40 mm and a length of 680 mm may be employed.

In a similar manner, in the case where the light emitting device is used for the backlight of a 55-inch liquid crystal display television in edge-type application, four (4) base members each having a width of 3 mm to 20 mm and a length of 340 mm may be employed, or two (2) base members each having a width of 3 mm to 20 mm and a length of 680 mm may be employed.

The flexible base member can be manufactured by using roll-to-roll method, in which several units of such an elongated base member (substrate member) can be processed together. In this case, sprocket holes may be provided in the base member.

A plurality of wiring portions are formed as electrically conductive members, disposed on one surface of the base member and directly or indirectly connected to the light emitting element. The wiring portions may be made of an electrically conductive thin layer having a single-layer structure or a stacked-layer structure of metal such as copper or aluminum or alloy thereof. The wiring portion may be disposed not only on a single surface of the base member, but also an inner side or on another surface of the substrate member according to the type of the substrate member.

It is preferable that the wiring portions have a thickness which does not impair their flexibility and, for example, a thickness of 8 μm to 150 μm can be employed.

The shape (pattern) of the plurality of wiring portions is not specifically limited, and generally, a similar shape or a shape conforming to the shape or pattern of the wiring of the substrate member etc., for mounting the light emitting elements or for connecting to the light emitting elements, or with further consideration of heat dissipation and/or mechanical strength can be preferably employed. For example, a crank shape; a polygonal shape such as a triangular shape, and a quadrangular shape; a shape with no sharp corners such as a circular shape and an elliptical shape; and a shape of those with partially irregular shape can be employed singly or in combination. The corners of the wiring portions are preferably rounded.

The plurality of wiring portions are disposed spaced apart from each other. Such terminal portions are made up of a pair of positive and negative terminals, and the number of the wiring portions which constitute the pair of the terminals is not specifically limited. For example, each of the pair of wiring portions may be made up of a single wiring portion or a plurality of wiring portions.

Disposing the wiring portions with a relatively large area with a combination of various shapes allows to increase the degree of arrangement freedom of the light emitting device. For example, with a rectangular base member, it can be possible that 6 light emitting elements are arranged 3 in the longitudinal direction and 2 in the lateral direction as 1 block and connected in parallel, then, 12 blocks are arranged in the longitudinal direction and connected in series by the pair of positive and negative wiring portions. It may be such that the base member has an approximately square shape, an approximately circular shape, or standard positive and negative wiring portions respectively.

In addition to the wiring portions directly or indirectly electrically connected to corresponding light emitting elements (that is, the wiring portions for providing electrical continuity), a wiring portion which has a similar shape or a different shape and does not contribute to conduction of electricity and may also be disposed. The wiring portion which does not contribute to providing electrical continuity can serve as a mounting portion for a heat releasing member or the light emitting element, or as a reinforcing member for the substrate member. For example, in the case where the base member has an elongated shape extended in the longitudinal direction, the wiring portions which do not contribute to providing electrical continuity are preferably disposed extended to the longitudinal end portions and at the both sides of the wiring portions in the lateral direction. The wiring portions preferably have a connector which allows supply of electricity to the wiring portions. This arrangement allows supply of electricity to light emitting elements from external power source.

In the case where a part of such wiring portions are disposed on approximately the entire surface of the flexible base member (preferably arranged without having a gap), stress due to bending of the substrate member etc., loaded on the light emitting elements and the sealing member to be described later can be reduced. More specifically, in the case where a base member of elongated shape is used, the wiring portions are preferably disposed elongated along the longitudinal direction of the base member, and more preferably, the wiring portions are disposed with a length of ⅓ to 1 of the longitudinal length of the base member.

As described above. on one surface of the base member, the plurality of wiring portions are spaced apart from each other and the separation creates grooves where the wiring portions are not disposed (in other words, portions where the base member is exposed). The grooves are defined between the wiring portions, so that the shapes of the grooves are in conformity to the shapes of the wiring portions, which may be, for example, a crank shape. The width of the grooves is preferably narrower than the width of the wiring portions, in other words, the wiring portions are preferably provided with a large area, and for example, a width of about 0.05 mm to 5 mm may be employed.

The wiring portions (both wiring portions that contribute to electrical continuity and wiring portions that not contribute to electrical continuity) are preferably disposed on the base member respectively with the largest possible area, so that heat dissipation can be improved.

Further, in the case where the a flexible substrate member is used, because the wiring portions are disposed on an entire surface of one surface of the base member with relatively large areas so that appropriate strength can be added to the base body while maintaining its flexibility. Thus, disconnection of wiring portions and breakage of substrate member due to bending of the flexible substrate member can be prevented effectively. More specifically, with respect to the area of the base member, the wiring portions are disposed with an area preferably 50% or greater, more preferably 70% or greater, further preferably 80% or greater, 85% or greater, or 90% or greater. Also, in the case where electrical isolation is needed between the wiring portions, in order to secure the isolation, the wiring portions are preferably disposed with the areas of about 99% or less, about 98% or less, or about 95% or less.

The covering layer covering the wiring portions preferably can serve as a reflective layer to reflect the light emitted from the light emitting element. It is preferable that the covering layer has, as described later, an opening where the wiring portions are exposed, and except for the opening, the covering portion covers approximately the entire surface of the substrate member. In addition, it is preferable that the covering portion also covers the grooves between the wiring portions.

In order to connect the light emitting element or the electrical component with the wiring portions, the opening is defined to expose the wiring portions. The shape and size of the opening is not specifically limited, but a minimum size sufficient for electrical connection of the light emitting element and the electrical component with the wiring portions is preferable.

The number of the openings provided for one substrate member is not specifically limited and for example, appropriately determined according to the number of the light emitting elements to be mounted on one substrate member.

Generally, the number and arrangement of light emitting elements are adjusted according to the output power, light distribution, or the like, and accordingly, the number and the positions of the openings are determined. The number of the openings can either be the same or different with respect to the numbers of the light emitting elements and the electrical component to be mounted. For example, in the case where 20 light emitting elements to be mounted with one light emitting element in one opening, 20 openings can be defined in the covering layer. Or in the case where 2 or more light emitting elements to be mounted in one opening, 10 or less openings for light emitting elements can be defined. In a similar manner for the electric component, a plurality of electric components may be mounted all together in one opening, openings may be provided for each electrical component, or separate openings may be provided for each connector of the electric component.

In some cases, the light emitting elements may not be mounted in the openings. For example, in the case where the light emitting devices are manufactured in several ranks (for example, light emitting devices of different outputs), with the use of a common substrate member (that is, the number and arrangement of the openings defined in the covering layer), different optical output can be obtained by changing the number of the light emitting elements to be mounted in the openings. In this case, some openings may not have any light emitting elements mounted therein. A region lacking the covering layer (i.e. an opening) may be formed in a region for disposing a member or the like, such as the connector described above, which supplies electricity to the light emitting elements.

In the case of flip-chip mounting, a part of groove is preferably exposed in a single opening.

The covering layer can be formed by using a resin such as a phenol resin, an epoxy resin, a BT resin, a PPA, a silicone resin or a urea resin. Also, the covering layer is preferably made of a material which reflects emission of the light emitting element and wavelength-converted light by a wavelength converting member to be described later. For this reason, a white filler such as $SiO_2$, $TiO_2$, $Al_2O_3$, $ZrO_2$, MgO, or $BaSO_4$; or pores of submicron sizes is preferably contained in the resin described above.

The covering layer is preferably disposed with a relatively small thickness, and particularly preferable that the covering layer is disposed so that the upper surface of the light emitting element is higher than the covering layer. More specifically, the thickness of the covering layer may be about 5 μm to 50 μm.

The substrate member having such a structure has flexibility. This arrangement allows its use in various applications, with in situ shape with the light emitting element mounted thereon or with a shape appropriately changed. The total thickness of the substrate member can be adjusted according to the thickness of each of the components described above, and for example, about 0.05 to 0.15 mm, preferably about 0.07 to 0.12 mm can be employed. The substrate member may be formed by stacking the base member, the wiring portions, and the covering layer which are described above with applying an adhesive agent etc. (for example, a silicone-based adhesive agent, an epoxy-based adhesive agent, or an acrylic-based adhesive agent, with a thickness of several micrometers to several tens of micrometers) between them, or by stacking them with the use of plating, thermal compression, or the like.

The weight of the substrate member can be appropriately adjusted according to the materials and thickness of the base member, the wiring portions, and the covering layer, and the size and number of the openings, and for example, a weight of 1 $g/cm^2$ or less, 0.9 $g/cm^2$ or less, 0.8 $g/cm^2$ or less, 0.7 $g/cm^2$ or less, is preferably employed. Accordingly, even with an addition of the weight of the light emitting elements etc., to be mounted on the substrate, a light emitting device of very light weight can be realized.

Light Emitting Element 30

A plurality of light emitting elements are disposed on the substrate member, with electrically connected to the wiring portions which are exposed from the covering layer. Particularly, in the above-described openings of the covering layer on the substrate member, the light emitting elements are preferably disposed respectively on the two wiring portions in a bridged manner or disposed on a single wiring portion. With such arrangements, the light emitting elements can be electrically connected easily to the pair of positive and negative wiring portions respectively.

The number and/or tone of color tone and/or arrangement of a plurality of light emitting elements are determined to satisfy the output and light distribution designed for the light emitting device. It is therefore accordingly the shape and arrangement of the wiring portions and/or openings of the covering layer are adjusted and the light emitting elements are mounted at the determined positions.

The light emitting element includes a semiconductor structure, a p-side electrode, and an n-side electrode.

The semiconductor structure, for example, includes an n-type layer, an active layer, and a p-type layer respectively made of a gallium nitride-based semiconductor and stacked in the order on a light-transmissive sapphire substrate member. It is not limited to a gallium nitride-based semiconductor, but also, a group II-VI-based semiconductor or a group III-V-based semiconductor may be used.

The n-side electrode and the p-side electrode can be formed with a single layer or staked-layer of known materials.

The light emitting element may be mounted on the substrate member in a flip-chip manner or a face-up manner.

In the case of flip-chip mounting, the p-side electrode and the n-side electrode of the light emitting element are connected to a pair of wiring portions via a pair of bonding member respectively. For the bonding member, for example, a solder of Sn—Ag—Cu-based, Sn—Cu-based, or an Au—Sn-based, or a metal bump such as Au can be used.

In the case of face-up mounting, the light emitting element is fixed on the base member (on the wiring portion) by an insulating bonding member such as a resin or by an electrically conductive bonding member as described above, and then, electrically connected to the wiring portions via wires. In the case where the substrate member of the light emitting element is electrically conductive, the light emitting element is electrically connected by the bonding member as described above.

In addition to the light emitting elements, an electrical component (including the protective element and the related components describe above) may be disposed on one surface of the substrate member. Such an electrical component may be disposed together with the light emitting element in the opening where the light emitting element is mounted or in a different opening provided separately. But, the electrical component is preferably disposed at a location so as not to absorb the light from the light emitting element. The protective element is preferably disposed at an appropriate position, for example, one protective element is mounted on a wiring portion, to which a plurality of light emitting elements are connected in series, at a position near a connector regardless of the arrangement of the light emitting elements.

The brightness of the light emitting elements can be adjusted by the structure, the constituent materials, the applied voltage, or the like. Also, the brightness of the light emitting device itself can be adjusted by increasing or decreasing the number of the light emitting elements. Thus, in the case of a straight-tube-type (40 W type) light source for lighting, the light emitting device according to the embodiments of the present invention can realize a total brightness of the light emitting elements 2000 lm or greater at a color temperature of 5000K, by appropriately adjusting the type and/or the number of the light emitting elements. Accordingly, while maintaining equivalent or greater performance than the fluorescent lamps of various types such as straight-tube types, circular types, and compact types that have been conventionally used, the light emitting devices of the embodiments of the present invention can offer smaller size and weight, and can be used in various application sites or locations or conformations.

Also, in the case of a light source for backlight, the total brightness of the light emitting elements can realize 900 lm or greater at a color temperature of 5000 K. Accordingly, the degree of arrangement freedom can be further expanded compared to that of the LED modules in which LEDs are mounted on a rigid substrate member made of such as glass epoxy, or further, compared to that of the conventional fluorescent lamps, and thus applications at various sites, locations and conformations which can not be realized in the conventional fluorescent lamps etc., become possible.

For example, the number (density) of the light emitting elements in one light emitting device can be 0.1 to 10 light emitting elements/cm$^2$. With the use of the substrate member described above, appropriate adjustments of the strength for the light emitting elements, heat dissipation of the light emitting element, supply of electricity, etc., become possible, so that such a density of the light emitting elements can be realized.

Sealing Member 20

The sealing member seals (covers) each light emitting element on the flexible substrate member. One light emitting element is preferably covered with one sealing member, but two or more light emitting elements may be enclosed by one sealing member. The sealing member preferably has transparency to the light from the light emitting element and light resistance and electrical insulation properties. The sealing member is preferably disposed to cover all the openings of the covering layer described above, but may be disposed not to cover some of the openings. In the specification, the term "transparency to light" means properties of transmitting about 60% or greater emission of the light emitting element, more preferably 70% or greater or 80% or greater of light emitted from the light emitting element.

The sealing member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

The sealing member preferably includes a wavelength converting member such as a fluorescent material capable of absorbing light from the light emitting element and emitting light of different wavelength. Examples of such a wavelength converting member include an oxide-based fluorescent material, a sulfide-based fluorescent material, and a nitride-based fluorescent material. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material (β-sialon-based fluorescent material) to emit green light, and a SCASN-based fluorescent material and a CASN-based fluorescent material to emit red light, are preferably used singly or in combination. Particularly, for the light emitting devices used for the display devices such as backlights of liquid crystal displays and TV-screens, a SiAlON-based fluorescent material and a SCASN-based fluorescent material are preferably used singly or in combination. Also, for lighting applications, a YAG-based fluorescent material or a LAG-based fluorescent material and a SCASN-based fluorescent material or a CASN-based fluorescent material are preferably used in combination.

In addition, the sealing member may contain a material which can scatter light (for example, a white filler such as $SiO_2$, $TiO_2$, $Al_2O_3$, $ZrO_2$, MgO, or $BaSO_4$; or pores of submicron sizes).

The shape of the sealing member is not specifically limited, but in view of light luminous intensity distribution and directivity of the light emitted from the light emitting element, a concave lens shape or a convex lens shape is preferably employed. Of those, a hemispherical convex lens shape may be most suitably employed.

The size of the sealing member is not specifically limited and appropriately adjusted in view of the brightness, directivity, etc., of the light emitting device. Particularly, the sealing member preferably has a size which can secure wider contact area with the first resin member, but in the case where a flexible substrate member is employed, a size which does not impair the flexibility of the flexible substrate member is preferable. For example, the sealing member preferably has a size which allows the complete covering of the light emitting element or greater, with a diameter or length of about twice or greater, more preferably not greater than about eight times, further preferably about five to six times greater with respect to the length of a side of the light emitting element. More specifically, a side (or diameter) of about 1 mm to 4 mm can be employed.

The sealing member may be disposed with its outer edge arranged on the covering layer, or in the opening of the covering layer.

As long as covering the light emitting element, the sealing member may not be directly in contact with the light emitting element and may have a space between the light emitting element, or the sealing member is disposed so that over the light emitting element, it contacts the light emitting element, but at the outer periphery of the light emitting element, it is not necessarily directly in contact with the covering layer which constitutes the substrate member and with the wiring portions, and disposed via the resin layer to be described later.

Resin Layer 40

The resin layer may be disposed laterally (outer periphery) to the light emitting element, for example, in the openings formed in the covering layer, outer periphery of the openings, or from the inner side of the openings toward the outer periphery of the openings, that is, extending onto the covering layer. Also, regardless of the presence of the wiring portions, the resin layer may be disposed, for example, in the groove portion between the wiring portions and/or directly under the light emitting element.

The resin layer is preferably in contact with the outer edge (side surfaces) of the light emitting element. Generally, the light emitting element is mounted on the substrate member by using a bonding member etc., but a part of the surfaces of the bonding member and/or the base member (for example, the wiring portions etc.,) generally tends to develop deterioration due to light than in the material of the resin layer. For this reason, the resin layer is preferably disposed so that in the vicinity of the light emitting element, a part of the surface etc., of the bonding member and/or the base member is covered with the resin layer. With this arrangement, the relatively intense light emitted from the light emitting element can be prevented from directly irradiating the bonding member and/or the base member, so that optical degradation of the constituent members of the light emitting device can be efficiently prevented.

The end portion of the resin layer at the opposite side of the light emitting element may be located either at an inner side of the outer edge, in conformity to the outer edge, or at an outer side of the outer edge of the sealing member. Of those, it is preferable to dispose the end portion of the resin layer in conformity to the outer edge, or at an outer side of the outer edge of the sealing member. With this arrangement, the contact area between the resin layer and the sealing member can be easily secured, so that the sealing member can be adhered more tightly to the light emitting device, particularly to the resin layer.

In other words, the size of the resin layer, that is, the plane area of the light emitting device in light extracting direction may be similar, larger, or smaller than the plane area of the sealing resin member, excluding the plane area of the light emitting element. Particularly, the size of the first resin member may be about ⅕ to 3 times, preferably about ¼ to 3 times, and more preferably ⅓ to 1.5 times of the plane area of the sealing resin member excluding the plane area of the light emitting element. Thus, with a large plane area of the resin layer, the contact area with the sealing member increases as described later, so that due to the adhesion of both, the adhesion of the sealing member of the light emitting device can be further enhanced.

The resin layer may be disposed, for example, with a thickness in a range of about several micrometers to several hundred micrometers. Particularly, portions in contact with the light emitting element preferably have a thickness corresponding to or less than the height of the side surfaces of the light emitting element. In the case where the resin layer is disposed in the whole portion of the opening, the portion in contact with the periphery of the opening preferably has a thickness not exceeding the depth of the opening. Preferably the thickness of the resin layer decreases from the light emitting element outward (outer side with respect to the canter of the light emitting element).

The resin layer preferably has transparency to the light from the light emitting element and light resistance and electrical insulation properties. The resin layer can be formed for example by using a resin having its base polymer of, a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins. Of those, a resin containing a silicone resin, an epoxy resin, or the like as its base polymer is preferable. In the specification, the term "a base polymer" means a resin having a highest content of the materials constituting the resin layer. The resin layer preferably contains, for example, a reflective material and/or a diffusion material such as a while filler such as $SiO_2$, $TiO_2$, $Al_2O_3$, $ZrO_2$, MgO, or $BaSO_4$; or pores of submicron sizes. With this arrangement, light can be reflected sufficiently.

The resin layer may be made of a single material or a combination of two or more materials. With this arrangement, the reflectance of light can be adjusted and also the linear expansion coefficient of the resin can be adjusted.

Particularly, the resin layer is preferably formed, including the same polymer as in the sealing member as described above, more particularly, including the same polymer constituting the base polymer of the resin layer, and more preferably including the same polymer of the base polymer of the sealing member as the base polymer of the resin layer. With this arrangement, at the portion where the sealing member is in contact with the resin layer, suitability and compatibility of the both resin members are preferable, so that the adhesion with the resin layer can be further secured, and strong adhesion of the sealing member in the light emitting device can be realized.

Advantageous Features

The light emitting device according to the embodiments includes, as described above, a flexible substrate member which uses a flexible base member, and while maintaining/improving the performance such as brightness and operation life time etc., required in the conventional usage, a significant downsizing and reduction in weight can be realized. That is, the light emitting device according to the embodiments of the present invention at least includes a substrate member and a plurality of light emitting elements and sealing members, and can realize a weight of 1 $g/cm^2$ or less, preferably 0.7 $g/cm^2$ or less, 0.4 $g/cm^2$ or less, or 0.1 $g/cm^2$ or less. More preferably, even with related components, such as a connector for connection with an external power source, a protective element, a fuse, a resistance etc., necessary for operating the light emitting device as designed, a weight of 1 $g/cm^2$ or less can be realized, and more preferably 0.7 $g/cm^2$ or less, 0.4 $g/cm^2$ or less, or 0.1 $g/cm^2$ or less can be realized. Thus, a light emitting device of very small weight can be obtained.

From a different point of view, for example, in the use as an alternative to the straight-tube type fluorescent lamps, for example, about ninety to one hundred and twenty (90 to 120) light emitting elements (for example one hundred (100) light emitting elements) can be mounted at uniform intervals with respect to the substrate member of about 120 cm×1.5 cm area, or about fifty to seventy (50 to 70) light emitting elements (for example sixty (60) light emitting elements) can be mounted at uniform intervals with respect to the substrate member of about 60 cm×1.7 cm area, and in the light emitting devices having such conformations, a total weight of 10 g or less, preferably 9 g or less, 8 g or less, or 7 g or less can be realized. More preferably, even with related components, such as a connector for connection with an external power source, a protective element, a fuse, a resistance etc., necessary for operating the light emitting device as designed, a total weight of 10 g or less, more preferably 9 g or less, 8 g or less, or 7 g or less can be realized.

The substrate member is formed extending in the longitudinal direction. The substrate member includes a first end portion, a middle portion, and a second end portion. The first end portion defines a locking hole which penetrates the substrate member. A plurality of light emitting element are disposed on the middle portion. An electrical component is disposed on the second end portion. Accordingly, insertion of bars into respective locking holes of a plurality of light emitting devices, or bundling with a ring or a cord, a plurality of light emitting devices can be compactly arranged, while preventing stress from concentrating on the light emitting elements or the sealing members. Further, even the light emitting device has a light weight, hanging the light emitting device by using the locking hole at the first end portion, a relatively heavy electrical component disposed on the second end portion can serve as a weight, so that the light emitting device as a whole can be kept in a straightened state.

The single light emitting device and the single sealing member have a weight of about 6 mg, but a total weight of the electronic component, such as a Zener diode, a bridge diode, a connector, a fuse, and a resistance may total about 200 to 350 mg. Hanging the light emitting device using the locking hole at the first end portion to some degree can prevent the light emitting device as a whole from curling or twisting, due to the self-weight of the substrate member or the weights of the light emitting elements and the sealing members which are arranged throughout of the surface of the substrate member. But arranging the electronic components in groups on the second end portion can prevent curling or twisting more efficiently.

The embodiments according to the present invention will be described below with reference to the drawings.

EMBODIMENT 1

Figure 1B:
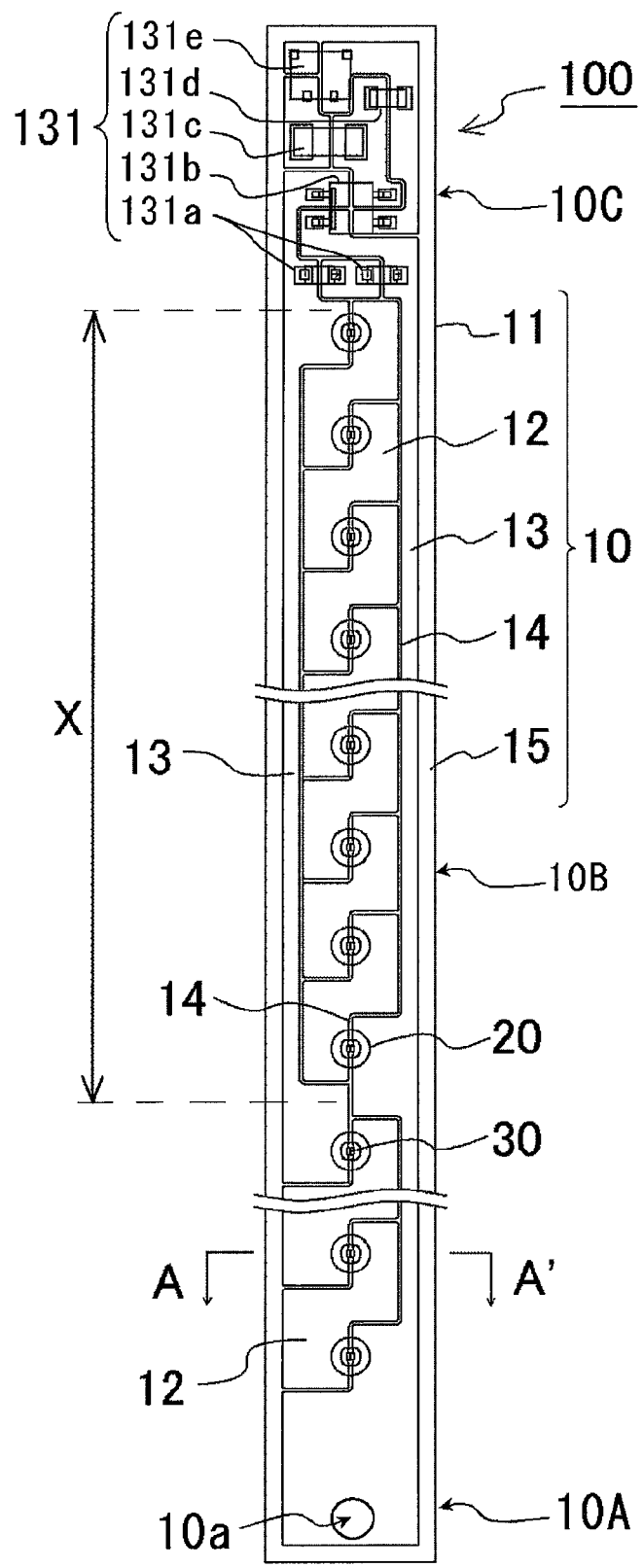
FIG. 1B is a schematic plan view showing an embodiment of light emitting device of the present invention.

The light emitting device 100 according to Embodiment 1 includes, as shown in FIG. 1A and FIG. 1B, the substrate member 10, the light emitting elements 30 disposed on the surface of the substrate member 10, and the sealing members 20 which are disposed on the substrate member 10 and cover the respective light emitting elements 30.

The substrate member 10 has a stacked layer structure made up of a flexible base member 11 made of a polyimide (about 25 μm thickness), a plurality of wiring portions 12 (copper foil, about 35 μm thickness) disposed on one surface of the base member 11 and spaced apart from each other by a groove portion 14, and an insulating covering layer 15 (about 15 μm thickness and made of an epoxy-based resin containing titanium oxide) disposed over them, which are stacked via an adhesive agent (a silicone-based adhesive agent). Of the wiring portions 12, the wiring portion 13 extending in the longitudinal direction is connected to the connector 131e which allows supply of electricity to the wiring portion 12.

The substrate member 10 includes a first end portion 10A, a middle portion 10B, and a second end portion 10C. The first end portion 10A defines a locking hole 10a for insertion of a locking member (a bar, a ring, a cord, etc.) which is not shown in the figure. As shown in FIG. 1B, the locking hole 10a is defined on a hypothetical line on which the light emitting elements 30 are disposed. The distance from the end of the substrate member 10 to the locking hole 10a is about 3 to 10 mm. On the middle portion 10B, a total of 120 light emitting elements 30 are arranged. On the second end portion 10C, an electronic component 131 is disposed. In the present embodiment, the electrical component 131 includes two Zener Diodes 131a, a bridge diode 131b, a fuse 131c, a resistance 131d and a connector 131e for external connection. The total weight of the electronic component 131 and a solder or an adhesive agent used to connect and/or fix individual electronic components is 1 g.

The substrate member 10 has a size (an area of 171.15 cm$^2$) of 1141 mm (length)×15 mm (width)×0.09 mm (thickness).

In order to establish electrical connection with the light emitting element 30, a groove portion 14 (between the wiring portions 12) and the wiring portion 12 are exposed from the covering layer 15 through the openings in a region of the substrate member 10.

The wiring portions 12 respectively have a crank shape and the groove portions 14 between the wiring portions 12 have a width of about 0.3 mm. The wiring portions 12, 13 are disposed with a total surface area of about 75% of the entire surface area of the upper surface of the substrate member 10 in the first embodiment, as viewed in FIG. 1B.

The light emitting element 30 includes a semiconductor structure, a p-side electrode, and an n-side electrode. In the semiconductor structure, the p-type semiconductor layer and the light emitting layer are partially removed to expose the n-type semiconductor layer, and an n-side electrode is formed on the exposed surface. A p-side electrode is formed on the upper surface of the p-type semiconductor layer. Thus, the n-side electrode and the p-side electrode are formed on the same surface side with respect to the semiconductor structure.

Each of the light emitting elements 30 (as described above) is disposed on respective adjacent pairs of the wiring portions 12. The light emitting elements 30 overlay surfaces of the wiring portions 12 that are exposed by removal of corresponding areas of the coating layer 15 of the substrate member 10, with the surface of the light emitting elements 30 having the n-side electrode and the p-side electrode facing downward, and electrically connected to the wiring portions 12 via the bonding member 35.

The light emitting elements 30 are disposed such that, for example, in a region indicated by X in FIG. 1B, twenty four (24) light emitting elements 30 are arranged in series at uniform intervals, and further, five (5) sets of the series arrangements are disposed in parallel, thus, a total of one hundred twenty (120) light emitting elements are disposed in a linear fashion. It should be recognized and understood that the twenty four (24) light emitting elements 30 are not all depicted in FIG. 1B. FIG. 1B shows the structure the light emitting device 100 in order to reveal the various features of the present invention, rather than show the entire length of the light emitting device 100. In other words, the overall length of the light emitting device 100 has been truncated.

The resin layer 40 is disposed on the upper surface of the substrate member 10 around the region where the light emitting element 30 is disposed and a part of the region directly under the light emitting element 30. The resin layer 40 is, for example, made of a silicone resin containing about 30 weight % of titanium oxide.

The resin member 40 is disposed from the outer edge of the light emitting element 30 and on the bonding member 35 to the outer periphery of the light emitting element, on the all portion in the opening and further onto a part of the covering layer 15. The thickness of the resin layer 40 can be approximately the same as the height of the light emitting element 30 at the light emitting element 30 side, and can be gradually reduced on the bonding member 35 to reach about 10 μm thickness on the covering layer 15. The length of the resin layer 40 from the end portion of the light emitting element 30 side to the end portion of the opposite side is about 1 mm.

In the case where the resin layer 40 is disposed at the outer periphery of the light emitting element 30 with a relatively large area, the sealing member 20 can be in contact with the resin layer 40 at a large contact area, so that the sealing member 20 can be firmly adhered to the substrate member 10. Further, the resin layer 40 has a reflectance higher than that of the bonding member 35 and the wiring portion 12, so that extraction of light from the light emitting element can be performed more efficiently.

The sealing member 20 is disposed on the substrate member 10 mounted with the light emitting element 30, on the portions including the light emitting element 30, the resin layer 40 disposed around the light emitting element 30, and a portion of the covering layer 15 disposed from directly under the resin layer 40 on the covering layer 15 disposed on an outer side of the light emitting element 30. The sealing member 20 is, for example, made of a silicone resin containing a total of about 10 weight % of fluorescent materials (LAG and SCASN). That is, the sealing member 20 contains the same type of polymer used to make the resin layer.

The outer edge α of the sealing member 20 is disposed on the covering layer 15 of the substrate member 10. The sealing member 20 is formed in a hemispherical shape by potting etc. The diameter of the hemispherical shape is, for example, about 3.5 mm.

The sealing member 20 is disposed containing the same base polymer as in the resin layer 40, thus, the adhesion between the sealing member 20 and the resin layer 40 can be secured. Particularly, in the light emitting device 100, the resin layer 40 and the sealing film 15 are in contact with each other with the entire surface of the resin layer 40 and all the side surfaces of the resin layer 40 disposed on the covering layer 15, and thus, a further contact area between the resin layer 40 and the sealing member 20 can be secured. Moreover, the resin layer 40 and the sealing member 20 are disposed with containing the same base polymer, so that good suitability and compatibility between the resin layer 40 and the sealing member 20 can be obtained and thus further firm adhesion can be realized.

Moreover, the surfaces and the interface between the bonding member 35 and the wiring portion 12 and the interface between the wiring portion 12 and the covering layer 15 can be covered with the resin layer 40, so that optical degradation of those members and detachment or the like, due to the optical degradation can be effectively prevented.

Five (5) light emitting devices 100 having the structure as described above were prepared and the total weight of the five light emitting devices 100 was measured. The obtained total weight was then divided by five to obtain a total weight of one light emitting device 100. As a result, 6.942 g was obtained. Accordingly, the light emitting device has a weight of 0.04 g/cm$^2$ and the light emitting elements are disposed at 0.7 light emitting elements/cm$^2$. The weight of the light emitting element 30 near the second end portion 10A where electric components 131 are locally crowded is 0.27 g/cm$^2$.

Also, the brightness of the light emitting device 100 was about 3000 lm at a color temperature of 5000 K.

The light emitting device 100 according to the embodiments of the present invention can realize a significant downsizing and reduction in weight along with improvements in the performance (brightness etc.) and operation life time etc., compared to that of the conventional fluorescent lamps or the like. As a result, the light emitting device 100 can be applied across a wider range of various conformations and applications.

EMBODIMENT 2

Figure 2A:
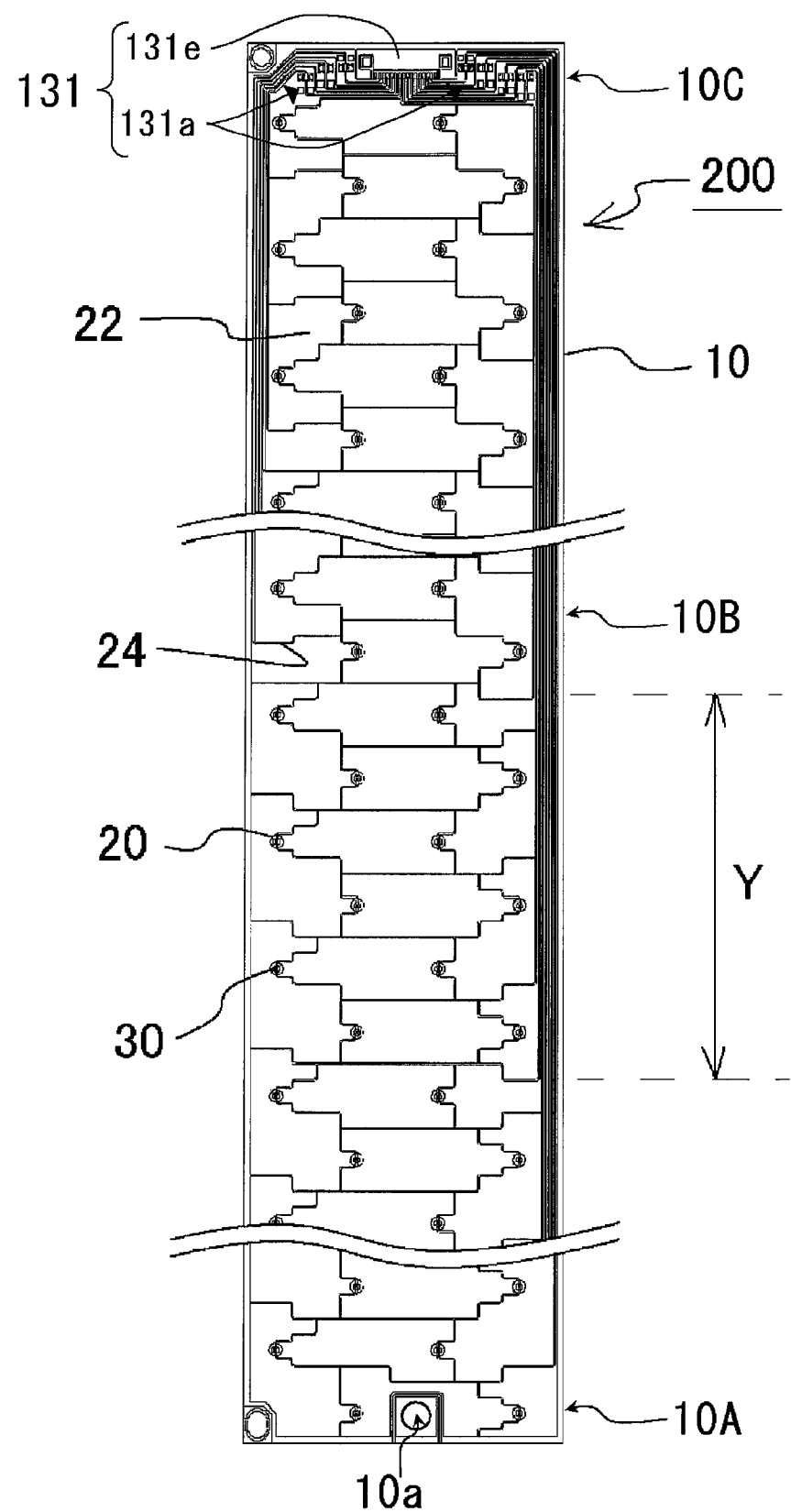
FIG. 2A is a schematic plan view showing another embodiment of light emitting device of the present invention.
Figure 2B:
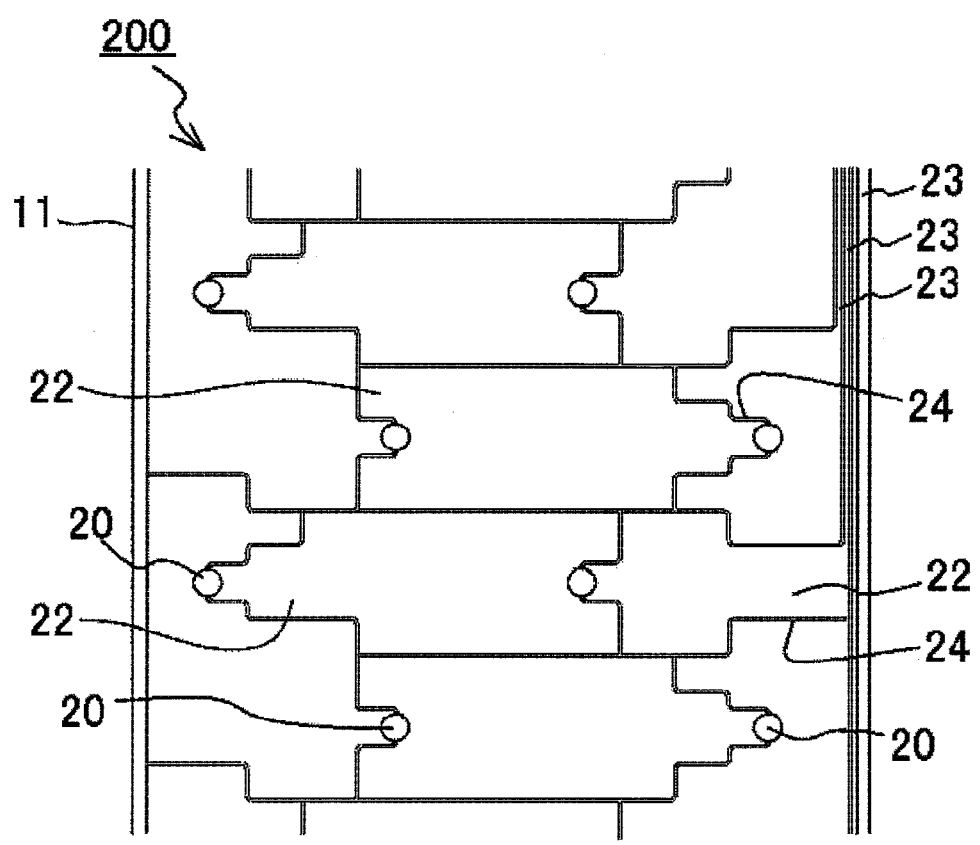
FIG. 2B is a partially enlarged view of FIG. 2A.

A light emitting device 200 according to Embodiment 2 has a substantially similar structure as in the light emitting device 100 of Embodiment 1 except that, for example as shown in FIGS. 2A and 2B, the pattern of groove portion 24 which separates wiring portions 22 does not have a simple crank-shape but has step-wise bend portions in both lateral direction and longitudinal direction. Accordingly, each of the wiring portions 22 is made into a crank-like shape with a plurality of recessed portions and protruded portions in a top view, and also, in order to supply electricity to the wiring portion 22, a part of the wiring portion 22 is integrally formed with the wiring portion 23 extending in the longitudinal direction and is connected to the connector 131e.

The light emitting device 200 has a substrate member with a size (an area of 538.42 cm$^2$) of 679.4 mm (length)× 79.25 mm (width)×0.09 mm (thickness), and for example, twelve (12) light emitting elements 30 are arranged in series in a region indicated by Y in FIG. 2A, and further, seven of the in-series arrangements are disposed to have a total of eighty four (84) light emitting elements on the substrate member.

The substrate member 10 includes a first end portion 10A, a middle portion 10B, and a second end portion 10C. The first end portion 10A defines a locking hole 10a for insertion of a locking bar which is not shown in the drawings. On the middle portion 10B, a total of eighty four (84) light emitting elements 30 are arranged. On the second end portion 10C, a connector 131 is disposed. In the present embodiment, the electronic component 131 includes seven Zener Diodes 131a and a connector 131e for external connection. The total weight of the electronic component 131 and a solder or an adhesive agent used to connect and fix those members of the electronic component 131 is 1 g.

The wiring portions 22 and 23 are disposed about 85% with respect to the whole area of the upper surface of the substrate member.

Five (5) light emitting devices having the structure as described above were prepared and the total weight of the five (5) light emitting devices was measured. The obtained total weight was then divided by five to obtain a total weight of one light emitting device. As a result, 21.84 g was obtained. Accordingly, the light emitting device has a weight of 0.04 g/cm$^2$ and the light emitting elements are disposed at a density of 0.16 light emitting elements/cm$^2$. The weight of the light emitting element near the second end portion where electronic components are locally crowded is 0.13 g/cm$^2$.

Also, the brightness of the light emitting device 200 was about 2100 lm at a color temperature of 11,000 K.

The light emitting device according to the present invention can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

As described above, it should be obvious that various other embodiments are possible without departing the spirit and scope of the present invention. Accordingly, the scope and spirit of the present invention should be limited only by the following claims.

What is claimed is:

1. A light emitting device comprising:
    a flexible substrate member extending in a longitudinal direction including a first end portion, a second end portion arranged opposite side to the first end portion in the longitudinal direction, and a middle portion arranged between the first end portion and the second end portion;
    a plurality of light emitting elements disposed on the middle portion and arranged along a virtual line that extends parallel to the longitudinal direction;
    a plurality of sealing members each sealing one or more of the plurality of light emitting elements, each of the plurality of sealing members contacting the substrate member;
    an electrical component fixed on the second end portion by solder or adhesive agent, and electrically connected to the plurality of light emitting elements; and
    a resin layer surrounding an outer periphery of a corresponding one of the light emitting elements, a plane area of the resin layer being about ⅓ to 3 times of a plane area of a corresponding one of the sealing members excluding a plane area of the corresponding one of the light emitting elements in a plan view,
    the substrate member having a locking hole penetrating through the substrate member in the first end portion, with the locking hole being disposed on an extension of the virtual line along which the plurality of light emitting elements are arranged wherein a sum of weights of the substrate member, the plurality of light emitting elements, and the plurality of sealing members is 1 g or less per 1 cm$^2$ of a main surface of the substrate member.

2. The light emitting device according to claim 1, wherein a number of the plurality of light emitting elements per 1 cm$^2$ of the main surface of the substrate member is 0.1 or greater or 10 or below.

3. The light emitting device according to claim 1, wherein brightness of the plurality of light emitting elements at a color temperature 5000 K is 900 lm or greater.

4. The light emitting device according to claim 1, wherein the substrate member comprises a flexible base member, a plurality of wiring portions disposed on a main surface of the base member, and a covering layer disposed on the plurality of wiring portions and defines a plurality of openings where a part of each of the plurality of wiring portions is exposed in each opening, and the plurality of wiring portions cover 50% or greater upper surface of the base member.

5. The light emitting device according to claim 1, wherein the substrate member has a length in the longitudinal direction in a range of 5 times or greater and 200 times or less with respect to a length in a width direction which is perpendicular to the longitudinal direction.

6. The light emitting device according to claim 1, wherein a thickness of the resin layer is approximately the same as a height of the corresponding one of the light emitting elements.

7. The light emitting device according to claim 1, further comprising
    a pair of bonding members disposed between the resin layer and the substrate member.

8. The light emitting device according to claim 7, wherein each of the light emitting elements are mounted onto the substrate member by flip-chip mounting with each of the light emitting elements is electrically connected to the substrate member via the pair of bonding members.

9. A light emitting device comprising:
    a flexible substrate member extending in a longitudinal direction including a first end portion, a second end portion arranged opposite side to the first end portion in the longitudinal direction, and a middle portion arranged between the first end portion and the second end portion;
    a plurality of light emitting elements disposed on the middle portion;

a plurality of sealing members each sealing one or more of the plurality of light emitting elements, each of the plurality of sealing members contacting the substrate member;

a plurality of electrical components fixed on the second end portion by solder or adhesive agent, and electrically connected to the plurality of light emitting elements; and a resin layer surrounding an outer periphery of a corresponding one of the light emitting elements, a plane area of the resin layer being about 1/5 to 3 times of a plane area of a corresponding one of the sealing members excluding a plane area of the corresponding one of the light emitting elements in a plan view, the substrate member having a locking hole defined in the first end portion, the plurality of electrical components including a connector and a resistance wherein a sum of weights of the substrate member, the plurality of light emitting elements, and the plurality of sealing members is 1 g or less per 1 cm$^2$ of a main surface of the substrate member.

10. The light emitting device according to claim 9, wherein a number of the plurality of light emitting elements per 1 cm$^2$ of the main surface of the substrate member is 0.1 or greater or 10 or below.

11. The light emitting device according to claim 9, wherein brightness of the plurality of light emitting elements at a color temperature 5000 K is 900 lm or greater.

12. The light emitting device according to claim 9, wherein the substrate member comprises a flexible base member, a plurality of wiring portions disposed on a main surface of the base member, and a covering layer disposed on the plurality of wiring portions and defines a plurality of openings where a part of each of the plurality of wiring portions is exposed in each opening, and the plurality of wiring portions cover 50% or greater upper surface of the base member.

13. The light emitting device according to claim 9, wherein the substrate member has a length in the longitudinal direction in a range of 5 times or greater and 200 times or less with respect to a length in a width direction which is perpendicular to the longitudinal direction.

14. The light emitting device according to claim 9, wherein
the locking hole is disposed at a position between a longitudinal edge of the substrate member in the first end portion and one of the plurality of light emitting elements disposed closest to the longitudinal edge of the substrate among the plurality of light emitting elements.

15. The light emitting device according to claim 9, wherein
the locking hole does not overlap with any of the plurality of light emitting elements when viewed along a direction normal to a surface of the substrate member on which the plurality of light emitting elements are disposed.

16. The light emitting device according to claim 9, wherein
a thickness of the resin layer is approximately the same as a height of the corresponding one of the light emitting elements.

17. The light emitting device according to claim 9, further comprising
a pair of bonding members disposed between the resin layer and the substrate member.

18. The light emitting device according to claim 17, wherein
each of the light emitting elements are mounted onto the substrate member by flip-chip mounting with each of the light emitting elements is electrically connected to the substrate member via the pair of bonding members.

* * * * *